Nov. 22, 1966 B. ANCKER-JOHNSON 3,287,659

SIGNAL GENERATORS USING SEMICONDUCTOR MATERIAL IN MAGNETIC AND ELECTRIC FIELDS

Filed Dec. 12, 1963 2 Sheets-Sheet 1

INVENTOR.
BETSY ANCKER-JOHNSON

BY Reynolds & Christensen

ATTORNEYS

INVENTOR.
BETSY ANCKER-JOHNSON
BY
Reynolds & Christensen
ATTORNEYS

United States Patent Office 3,287,659
Patented Nov. 22, 1966

3,287,659

SIGNAL GENERATORS USING SEMICONDUCTOR MATERIAL IN MAGNETIC AND ELECTRIC FIELDS

Betsy Ancker-Johnson, Seattle, Wash., assignor to The Boeing Company, Seattle, Wash., a corporation of Delaware Filed Dec. 12, 1963, Ser. No. 330,182
13 Claims. (Cl. 331—94)

The present invention relates to signal generating circuits and more particularly to improved high frequency signal generators of the oscillator type and wherein the frequency of the signals is readily controllable and also wherein mechanical means can be used to select a given output frequency.

High frequency signal generating circuits such as oscillators are well known in the art and are commonly used in a number of ways at the present time in various portions of electronic equipment. For example, in electronic computers and communications equipment both variable frequency and constant frequency oscillators are used as information signal generating devices and as timing devices. It is often desirable to be able to provide high frequency signals wherein the frequency remains constant for a given set of input or control parameters as well as to provide signals wherein the frequency can be varied not only in accordance with controls applied at the input to the oscillator but also by means of simple mechanical frequency selecting means at the output. Such circuits wherein the frequency of the oscillation can be selected by some form of rugged mechanical tuning means are readily adaptable to field equipment in the communications art.

It is, therefore, an object of the present invention to provide a high frequency signal generator.

A further object of the present invention is to provide a variable frequency oscillator adapted to provide signals within a given frequency range and wherein the frequency range of the signals generated is controlled in accordance with easily controllable input circuit means.

Another object of the present invention is to provide a simplified variable frequency oscillator which does not require the use of tank or energy storing circuits.

Another object of the present invention is to provide an oscillator which produces output signals of a plurality of frequencies and wherein simplified means can be used to obtain a selected one of the multiple frequencies being generated.

An additional object of the present invention is to provide a high frequency oscillator wherein signals within a given frequency range can be produced by the application of suitable control signals to the input circuitry and wherein a specific output frequency can be derived by using the oscillator in combination with simplified mechanical or electromechanical frequency selection devices without the need for electronic frequency selection means.

A further object of the present invention is to provide a compact high frequency signal generating device or oscillator utilizing the characteristics of a piece of semiconductor material.

Various types of semiconductor materials are used at the present time to provide rectifying, signal generating, and amplifying devices. For example, pieces of semiconductor material having a distinct junction therein with one portion being of a type such that an excess of negative charge carriers exists therein while the other end has an excess of positive charge carriers or holes therein are commonly used as rectifying devices since it is found that electrical current passes readily in one direction through the devices but current flow in the opposite direction is substantially impeded. It has been discovered more recently that certain types of semiconductor material in specific configurations can be used for generating high frequency signals. For example, in U.S. Patent No. 2,891,160 to LeBlond there is disclosed a basic oscillator circuit which utilizes a tank circuit or energy storing network connected in series or parallel circuit relationship with a junction semiconductor device having suitable bias means applied thereto.

Another form of high frequency signal generating apparatus is discussed on pages 141–148 of the July 1962, issue of "The Proceedings of the International Conference on Physics of Semiconductors." In that article, as well as in various articles referenced therein, the ability of certain semiconductor materials to exhibit high frequency oscillation characteristics when subjected to appropriate electrical and magnetic fields is discussed. It is believed that the oscillations produced under such conditions of applied electric and magnetic fields is due to helical instability of a plasma which is generated within the semiconductor material. As illustrated at page 146 in the above referenced article, signals in the low megacycle range can be produced when the magnetic field which is parallel to the electric field is increased or made of a sufficient intensity. As indicated in the article, however, it has been found that when the magnetic field reaches a certain intensity the oscillations become incoherent due to turbulence within the material and also if the electric field intensity is large, impact ionization occurs and an uncontrollable plasma is generated.

I have discovered that if a low density plasma is established in a piece of semiconductor material in the presence of a high intensity electric field and low intensity parallel magnetic field, very high frequency signals well into the gigi-cycle ($10^9$ c.p.s. and abbreviated gc.) range are generated. Normally when a semiconductor material is subjected to a strong electric field impact ionization occurs so that a very major decrease in the resistivity of the material occurs and a frequently uncontrollable high density plasma is established within the material. The occurrence of the impact ionization phenomena prevents the establishment of the low density plasma which is required in the present invention, and thus it is seen that difficulty is normally encountered in establishing a high intensity electric field and yet preventing the occurrence of impact ionization.

I have discovered that if a plasma consisting of a large number of positive and negative charge carriers or electron-hole pairs can be generated within a piece of semiconductor material in a manner such that the density of the electron-hole plasma in one portion of the material differs from the density of the plasma generated in another portion of the material, a relatively high intensity electric field can be established within the material and yet the occurrence of impact ionization can be avoided. Thus, a low density plasma can be established and the occurrence of the desired high frequency signals will take place. As used herein, the term "plasma" shall mean a large collection of positive and negative charge carriers in approximately equal density. As discussed in more detail hereinafter, the density of the plasma can be made different in different parts of the semiconductor material using semiconductor materials having the relative purity thereof graded or differing from one section thereof to another so that the number of electron-hole pairs generated within the material or lost due to the recombination effect will result in the establishment of a low density plasma within the material under the required conditions of applied electric and magnetic fields. When a bulk semiconductor (that is, one which is substantially homogeneous in regards the distribution of impurity centers therein) is used the intensity of radiation applied to the material for generating the desired electron-hole pairs can be controlled so that a radiation gradient exists from one section of the material to another and hence the density of the resulting electron-hole pairs varies from one section of the material to the other. Also as described hereinafter, an abrupt or discontinuous change in the density of the electron-hole pairs can be made to exist or a gradual transition in the plasma density can be established and in each case a high electric field can be established within the material without the occurrence of impact ionization.

In accordance with one embodiment of the present invention a piece of semiconductor material which is substantially pure at one end has the opposite end thereof doped with suitable impurities so that a transition (which may be in the form of a discontinuity) in the relative purity or number of impurity centers in the material exists from one end of the semiconductor to the other. As a result of this gradation in the relative purity of the material it is found that a gradation in the density of electron-hole pairs can be made to exist within the material. The transition in relative purity can be in the form of a well defined junction or as described hereinafter can be made to be of a gradual transition. The piece of semiconductor material having this gradation in impurity is subjected to a very high reverse electric bias and simultaneously to a low intensity parallel magnetic field. When current carriers are then injected into the material a low density plasma having a relatively small radius will be established therein and as a result thereof extremely high frequency signals are generated. In this embodiment of the invention the frequency of the signals generated is dependent upon the electric and magnetic field intensities and is found to be proportional to the product of the two fields. Thus, by providing any of a number of well known devices for controlling the intensity of the electric field, the magnetic field, or both, the frequency of the output signals can be modulated or controlled.

In another embodiment of the present invention the low density plasma is established in the presence of a high electric field and low magnetic field by utilizing a piece of semiconductor material the external surface of which has been roughened or made relatively unsmooth by means of sand blasting or similar techniques in a manner such that the surface condition of at least one side of the material is different near two opposite ends thereof. That is, at least one side of a piece of semiconductor material is subjected to sand blasting or other similar roughening techniques so that one section of one or more sides thereof has a relatively rough outer surface while another section is relatively smooth. This gradation in the surface condition of the semiconductor material causes a gradation or change in the surface recombination effect from end to end within the material and hence a gradation in electron-hole density can be made to occur. When such a piece of material is subjected to a high electric field and simultaneously to a relatively low magnetic field, the subsequent injection of current carriers therein will cause a low density plasma to be established within the material. As a result thereof extremely high frequency signals are generated in an appropriate signal output circuit coupled with the material.

In each of the two above described embodiments the means for injecting current carriers into the material can take place by using current injection contacts and pulse sources or by means of a source of electromagnetic radiation of suitable wavelength and intensity to cause the generation of electron-hole pairs within the material. In a third embodiment of the invention a piece of bulk semiconductor material (that is, a piece of a single type of semiconductor material) which is substantially of homogeneous characteristics is subjected to electromagnetic radiation in a manner such that a gradation in the electron-hole density (or plasma density) exists and the required low density plasma can be established within the material during the presence of a strong electric field and relatively weak magnetic field. In this embodiment, the intensity of the radiation applied to one side of a piece of semiconductor material is graded in intensity from one end of the material to the other. Thus, one end of the material is subjected to relatively intense electromagnetic radiation while the other end has little or no radiation impinging thereon. As a result thereof, a low density plasma is established in the material. The gradation in intensity of the applied radiation can be achieved in various ways and for purpose of illustration, a source of electromagnetic radiation in combination with a lens system which includes a gradation filter disposed between the source and a piece of semiconductor material serves to cause one end of the semiconductor material to have substantially no radiation applied thereto, while the other end of the material is subjected to a relatively intense bombardment of photons. In this embodiment, the source of radiation can itself be the controlling means for establishing the low density plasma within the material while an additional electrical bias circuit provides the necessary high electric field to the material across non-injection contacts.

In another embodiment of the present invention a piece of semiconductor having a geometric configuration such that the cross section area thereof varies from end to end is placed in an appropriate electric and magnetic field and a plasma is then established therein. As a result of the gradation or transition in cross sectional area it is found that a low density plasma can be established in a high electric field and low magnetic field without the occurrence of impact ionization. The desired high frequency oscillations are therefore produced.

I have discovered that the point at which a signal output circuit is coupled with the piece of semiconductor material when a plasma density gradation exists therein has a bearing upon the specific frequency of the signals being sensed. That is, if the signal output circuit is coupled near one end of the semiconductor material under a given set of conditions for the applied electric field and magnetic field, signals of a first frequency are observed. If under the identical conditions of applied electric and magnetic field strength the signal output circuit is coupled near the opposite end of the semiconductor material, a different frequency is observed, with the transition in the frequency from one end to the other being continuous. At any given point along the body of semiconductor material, however, the frequency of the output signals remains constant for a given amplitude or intensity of applied electric and magnetic fields. Thus, the intensity of the electric and/or magnetic fields can be varied to determine the frequency of the output signals within a give range, or these fields may be held constant and tuning may be accomplished by providing suitable mechanical means for varying the point at which a signal output circuit is coupled with the material. Thus several simple means are provided for deriving a specific selected signal frequency from the device. For example, rugged high frequency signal generating systems can be provided in which (1) a variable resistance controls the magnetic field intensity; or (2) a simple mechanical tuning arrangement can be used to select a specific high frequency signal from signals being generated within a given range by the device. In the latter embodiment a plurality of signal output circuits could likewise be coupled at different points to one of the signal generators so that a plurality of high frequency signals each of a different frequency could be simultaneously provided in the various signal output circuits.

The above and additional objects and advantages of the present invention will be more clearly understood from the following description when read with reference to the accompanying drawings wherein, FIGURE 1 is a schematic circuit diagram illustrating one manner of constructing a high frequency signal generator in accordance with the present invention;

Figure 1:
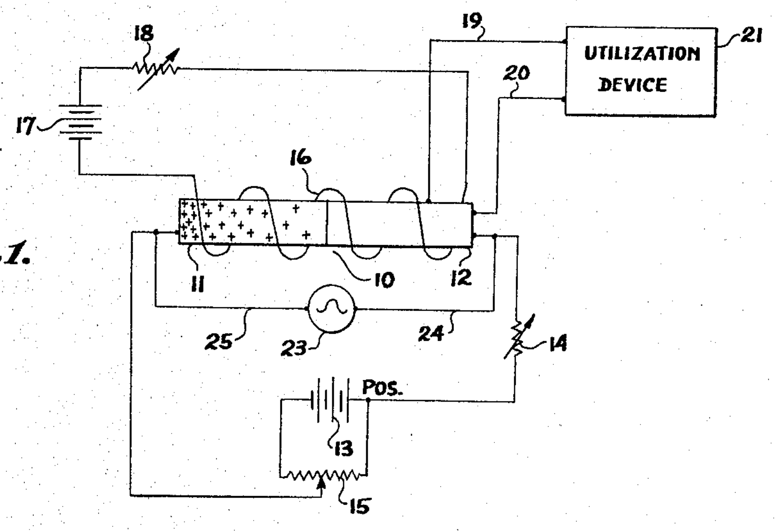

Referring now to the drawings and in particular to FIGURE 1, there is illustrated a piece of semiconductor material 10 which is shown for purpose of illustration as a junction type device which can be produced in a number of ways well known in the art at the present time so that one end 11 thereof contains a relatively large number of impurity atoms and thus is referred to as of an extrinsic type, while the other end 12 contains considerably fewer impurities. The end 12 may be substantially pure and, therefore, can be referred to as being intrinsic type material. While the end of the semiconductor material 10 which is of the extrinsic type can be either of the N-type or the P-type, it is shown for purpose of illustration in FIGURE 1 as being of the P-type and therefore a series of plus signs (+) are illustrated near the left end 11 of the semiconductor 10. Such a device can be made, for example, starting with a pure melt of semiconductor material such as germanium, silicon, or other material and growing a crystal therefrom. Impurities can be added to the material such as, for example, indium, gallium, aluminum, or other similar materials, in a manner to cause a junction to be produced within the device so that one end thereof will have an excess of holes.

In a similar manner a junction device wherein one end of the device is of susbtantially pure or intrinsic material and wherein the other end is of the extrinsic type having an excess of electrons therein can be produced by growing a single crystal of germanium, silicon, or similar semiconductor material and wherein one end thereof is doped using an impurity such as, for example, arsenic, phosphorous, or other similar types of material.

An electric field is established from end to end in the semiconductor material 10 and for purpose of illustration there is shown in FIGURE 1 a source of variable D.C. potential in the form of a battery 13 having its positive terminal connected to the pure end 12 of the semiconductor device 10 as well as to a resistor 15. The negative terminal is connected to the opposite end of resistor 15 and as seen in FIG. 1 a voltage selecting tap is shown in engagement with resistor 15 and the extrinsic end 11 of the semiconductor 10. If the semiconductor device 10 is of the type wherein one end is doped with an impurity of the type providing excess electrons and referred to as N-type material, the positive end of the bias source is connected to such end. This type of bias arrangement shall be referred to hereinafter as a reverse bias. A variable impedance element shown for purpose of illustration as a resistor 14 of variable magnitude is connected in series circuit arrangement with the semiconductor device 10 and battery 13 so that the magnitude of the electric current produced in the device 10 in the manner described hereinafter is selectively variable. Means is provided for establishing a magnetic field parallel to the length of the semiconductor device 10 and parallel to the electric field produced thereacross by the battery 13. In the illustrative example of FIGURE 1 the parallel magnetic field is produced by a winding 16 disposed about the body of the semiconductor device 10 and energized by a battery 17 having a variable impedancme element in the form of the variable resistor 18 connected in series circuit arrangement therewith.

A signal output circuit is shown as including a first signal output terminal 19 which is connected to one side of the semiconductor device 10 and is illustrated as being connected to one of the sides near the pure or intrinsic end 12. A second signal output terminal 20 is shown as being connected to the extreme right end of the semiconductor device 10. Any suitable utilization device 21 can be connected to the signal output terminals 19 and 20 for utilizing the high frequency signals which are generated.

The resistor 14 and variable voltage provided by the battery 13 and resistor 15 are so adjusted that a relatively high electric field is established across the semiconductor device 10, and yet any current flow therethrough can be held to a low magnitude. It should be noted that the bias applied to the device 10 by the battery 13 can be adjusted so that only a small number of electrons tend to be injected into the extrinsic end 11 as a result of the bias. Due to the reverse nature thereof, little or no current flows through the material. That is, those carriers which would be injected at the end 11 as a result of the bias would be lost due to recombination at the impurity centers. When the electric field is then further increased by suitable means such as a pulse source a sufficient number of current carriers will be injected into the semiconductor device 10 to cause the generation of a low density electron-hole plasma within the material. Due to the reverse bias and gradation in doping of the material the electron-hole density varies from end to end in the material and hence the plasma can be sustained and yet held to a low density. During the presence of this low density plasma in the low intensity magnetic field and high intensity electric field high frequency signals are provided in the signal output circuit.

For purpose of illustration a signal generator 23 is illustrated as having a first signal output terminal 24 connected to the end 12 of the device 10 and a second signal output terminal 25 connected to the opposite end 11 of the semiconductor device 10. The signal generator 23 can be any well known type and is preferably a pulse generator which is adapted to provide current pulses of a selectable substantially constant amplitude. The amplitude of the plasma created in the semiconductor device can thus be controlled, and in practice is held to a low value and one such that impact ionization does not occur. With a proper pulse source 23 the D.C. bias can be reduced to zero and the electric field and low density plasma then controlled by the pulse source alone.

The frequency of the signals provided to the signal output terminals 19 and 20 is proportional to the product of the parallel electric and magnetic fields established within the semiconductor device. Since the semiconductor device 10 has in one end thereof impurity centers and is operating in a condition such that a reverse bias is applied thereto, it will be seen that upon termination of the input signal which creates the plasma or flow of charge carriers within the material, the output signals will be discontinued. That is, the continued flow of plasma within the device 10 is dependent upon the current injection provided by a suitable signal source. Thus when a pulsed control signal is applied a series or train of high frequency pulses will be generated. When the applied input pulse terminates, the output signals terminate as rapidly as the plasma then existing in the semiconductor device can decay. If a continuous source of current injection is provided then a continuous high frequency output signal is obtained.

Figure 2:
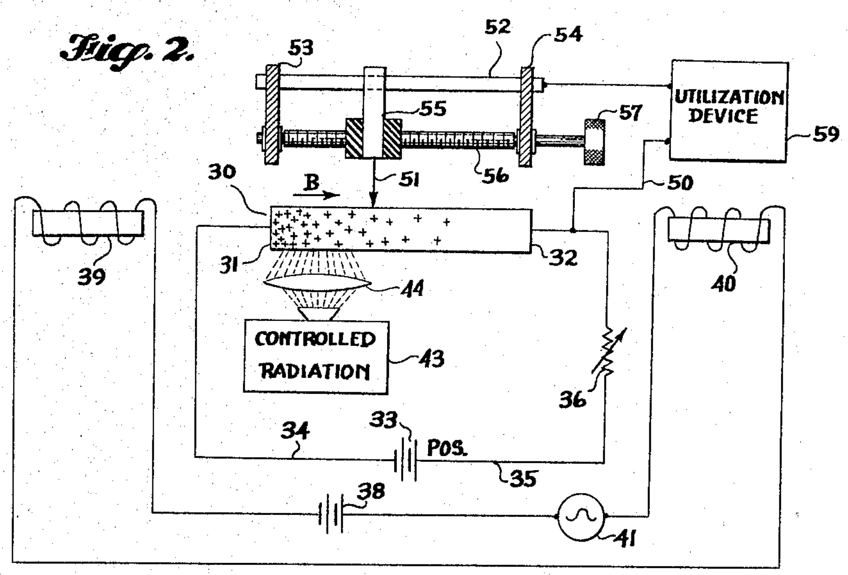
FIGURE 2 is an embodiment of the present invention illustrating by means of a schematic circuit diagram a method of producing the desired high frequency signals and wherein there is further illustrated simplified mechanical means for selecting the frequency of the output signals.

When a piece of semiconductor material such as that illustrated in FIGURE 1 as the device 10 is subjected to a high reverse electric bias and also to a parallel magnetic field, the frequency of the output signals produced by the low density plasma within the material is a function of the point at which one of the signal output terminals is coupled with the material. Therefore, referring now to FIGURE 2, there is illustrated another embodiment of the present invention and including mechanical means for selectively varying by a small amount the frequency of the output signals applied to a utilization device. Referring now to FIGURE 2, it will be seen that a piece of semiconductor material 30 is provided. A well defined junction between the extrinsic and intrinsic material need not exist, and therefore, for purpose of illustration, it will be seen in FIGURE 2 that one end 31 of the semiconductor device 30 is doped in a manner such that a large excess of holes is provided, while the other end 32 is shown as being plain or of the intrinsic type of material. A gradation in the relative purity from one end of the material to the other is intended to be illustrated by means of the gradual change in the number of plus signs from one end to the other on the device 30. A battery 33 having its negative terminal 34 connected to the end 31 and its positive terminal 35 connected through a variable resistor 36 to the end 32 of the device 30 serves to provide an electric field across the device 30 which is of proper polarity to be a reverse bias. A second battery 38 is connected to a pair of coils 39 and 40 shown schematically in FIGURE 2 as the means for providing a magnetic field parallel to the direction of current flow through the semiconductor device 30. It is obvious of course that a permanent magnet could be used to establish the magnetic field when the field is not to be varied as one of the controlled input means.

The frequency of the signals generated is proportional to the intensity of the electric field and also to the intensity of the magnetic field, and therefore for purpose of illustration there is shown in FIGURE 2 a signal generator 41 connected in series circuit arrangement with the battery and magnetic field establishing coils 39 and 40. The plasma necessary to produce the desired high frequency oscillations is established in the semiconductor material 30 by a radiation source 43 together with a lens system 44 which is adapted to focus the radiant energy generated by the source 43 upon the semiconductor material 30. It is preferable although not necessary that the radiant energy be focused upon the extrinsic region 31 of the semiconductor device 30. When the impinging radiation is of the proper wavelength, electron-hole pairs are generated within the semiconductor material and hence a plasma is produced. The magnitude of the resulting flow of charged particles is held to a low value since the material has the above described gradation in relative purity and a reverse bias exists across the material.

In the embodiment of the invention illustrated in FIGURE 2 the signal output circuit includes a first output terminal 50 connected to the right end 32 of the semiconductor device 30 and also a second signal output terminal 51 which is shown as being coupled with the body of semiconductor material 30 at any selected point along one side thereof. The means for adjusting the point of engagement of the terminal 51 includes a buss bar 52 supported by a pair of stationary insulating members 53 and 54. A traveling nut 55 made of insulating material is threaded on a shaft 56 and carries the contact 51 which engages the buss bar 52 and also the material 30. The threaded shaft 56 is supported by suitable bearings in the members 53 and 54 and is shown as having an adjustment knob 57 on the right end thereof. The arrangement is such that the shaft 56 can be selectively rotated manually or by other suitable means and in response thereto the point of contact of the signal output terminal 51 with the semiconductor device 30 is varied. Thus it will be seen that a specific selected frequency can be supplied to the utilization device 59 under a given set of electric and magnetic field intensities with selection within a small range being easily achieved by means of rotation of the threaded shaft 56. It should be understood, of course, that the simplified mechanical means illustrated in FIGURE 2 for varying the point at which the signal output terminal 51 is placed in contact or energy exchange relationship with the body of semiconductor device 30 is shown for purpose of illustration only and that various forms of other mechanical, electromechanical or similar systems can be utilized and also that a high frequency probe could be used rather than a direct contact.

Figure 3:
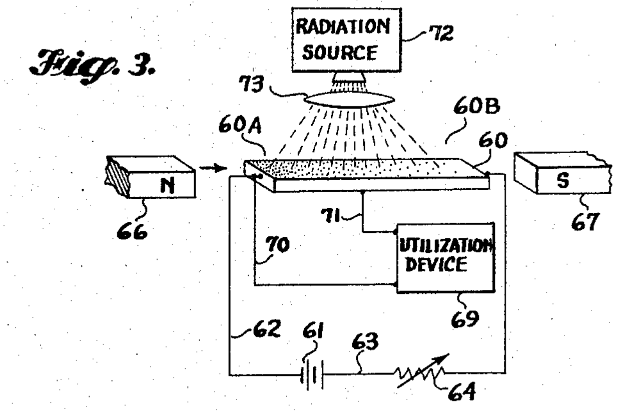
FIGURE 3 is an additional embodiment of the invention showing by way of circuit diagram another apparatus for producing the desired high frequency signals.

In FIGURE 3 another embodiment of the present invention is illustrated which includes a piece of semiconductor material 60 which may be any one of a number of well known types of material having impurity centers therein. For example, the material 60 may be P-type indium antimonide. A relatively high electric field is established from end to end within the material 60 and for purpose of illustration a source of D.C. potential in the form of a battery 61 having its negative terminal connected by a lead 62 to one end 60A of the device 60 and its positive terminal connected by a lead 63 and variable impedance element shown for purpose of illustration as a variable resistor 64 to the other end 60B of the device 60. A relatively low intensity magnetic field is established parallel to the electric field and for purpose of illustration there is shown a north and a south pole 66 and 67 respectively of a permanent magnet so positioned that the device 60 has the required magnetic field established therein. Any suitable utilization device 69 is connected by means of the leads 70 and 71 to the device 60. A radiation source 72 in combination with a lens system 73 is adapted to selectively provide electromagnetic radiation to the semiconductor device 60 and along one of the long sides thereof, the device 60 for purpose of illustration being shown as a rectangular parallelopiped.

The left end 60A of the semiconductor device 60 has been sandblasted so that the outer surface thereof is relatively rough in texture compared to the right end 60B thereof which has not been sandblasted. The degree of roughness or surface finish of the piece of semiconductor material 60 is graded between the ends 60A and 60B, and to illustrate this surface condition a large number of dots have been indicated on the left end 60A with the number of dots decreasing until as seen in FIGURE 3 the right end of the semiconductor device 60 is relatively smooth and hence has no dots thereon. While sandblasting has been mentioned as a means for producing the desired gradation in relative surface condition of the semiconductor device 60, it will of course be obvious to those skilled in the art that other suitable techniques can be used for providing the required gradation in surface finish from one end to the other of the device 60.

The operation of the apparatus of FIGURE 3 is similar to that of the embodiments illustrated in FIGURE 1 and FIGURE 2 in that a relatively high intensity electric field and a relatively low intensity parallel magnetic field are established within the material 60. The impingement of the photons from the radiation source 72 upon the surface of the semiconductor device 60 will cause the generation of electron-hole pairs of a graded density within the semiconductor material. As a result it is found that a plasma of low density is established within the semiconductor material. The left end of the device 60A is considerably rougher than the right end 60B and hence, as is well known in the art, the surface recombination effect will be more pronounced at the end 60A. Also as seen in FIGURE 3, the negative terminal of the battery 61 is connected to the end 60A where electrons tend to be injected and where the recombination is faster. With the parts connected in the manner illustrated in FIGURE 3, a low density plasma is established within the semiconductor device 60 and hence the desired high frequency signals are provided to the utilization device 69 via the signal output terminals 70 and 71. While the signal output terminals 70 and 71 are shown as being directly connected to the device 60, it should of course be understood that other suitable arrangements could be provided for sensing the high frequency signals which are generated during the occurrence of the low density plasma within the device 60. Suitable controls in the form of modulation means can be part of the radiation source 72 so that the intensity and wavelength of the radiation applied to the device 60 can be controlled. Also, as discussed above, the electric and/or magnetic field intensities may be controlled to further modulate or control the frequency of the signals generated.

In each of the embodiments thus far illustrated the semiconductor material used has been of the type having a number of impurity atoms disposed within the semiconductor material and thus the material is generally referred to as being of the extrinsic type. In the embodiment of the invention illustrated in FIGURE 4 a piece of semiconductor material 80 which may be of the intrinsic type or substantially pure bulk semiconductor material is utilized for the generation of high frequency signals in the gc. (kilomegacycle) range. It will be seen in FIGURE 4 that the piece of bulk semiconductor material 80 is subjected to a high intensity electric field by means of the source of D.C. potential illustrated as a battery 81 having its positive terminal 82 connected via a variable impedance element illustrated as a variable resistor 83 to one end of the semiconductor device 80 while its negative terminal is connected to the other end of the device 80. The actual connections to the material are such that little or no current injection thereupon tends to occur. A permanent magnet which is shown as including the pole faces 84 and 85 provides a low intensity magnetic field parallel to the electric field within the bulk semiconductor 80. A signal utilization device shown for purpose of illustration as the device 86 is connected to the semiconductor material 80 by the signal output leads 87 and 88 with the signal output lead 87 being illustrated as being soldered to the semiconductor material 80. A lens 89 serves to focus electromagnetic radiation from the radiation source 90 on the piece of semiconductor material 80. A filter shown for purpose of illustration as a prismatic or wedge-shaped filter 91 is disposed between the lens 89 and the bulk semiconductor material 80. The filter 91 has the characteristic that radiation passes through one end thereof substantially unimpeded or unaffected while at the other end a large percentage of the radiation applied from the source 90 is absorbed. As a result the semiconductor material 80 has a radiation pattern impinging thereon which is of a type such that one end of the semiconductor material 80 is subjected to a relatively intense radiation while the other end has little or no radiation impinging thereon. A uniform or gradual gradation in the intensity of the applied radiation is produced by the filter 91 illustrated in FIGURE 4. The generation of electron-hole pairs and hence the production of a plasma within the material 80 is not only dependent upon the intensity of the applied radiation but also upon the wavelength (depending on the impurity content) and hence it should be noted that signal sources having different wavelengths and substantially identical intensities could be used as applying their radiation to different portions of the material 80 to cause the desired effect.

Figure 4:
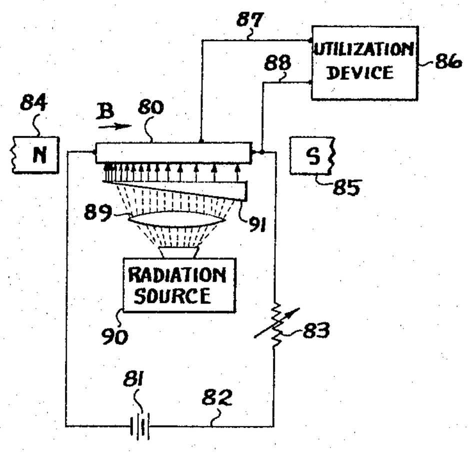
FIGURE 4 is a circuit diagram including a piece of bulk semiconductor material and associated apparatus including a source of electromagnetic radiation for carrying out the present invention.

With the arrangement such as that illustrated in FIGURE 4, the density of the resulting electron-hole pairs varies from one section of the material to another and thus a low density electron-hole plasma is established and maintained within the piece of bulk semiconductor material 80 in the presence of a relatively strong electric field and a relatively weak parallel magnetic field. As a result of these conditions high frequency signals in the $10^9$ cycles per second range are generated.

Figure 5:
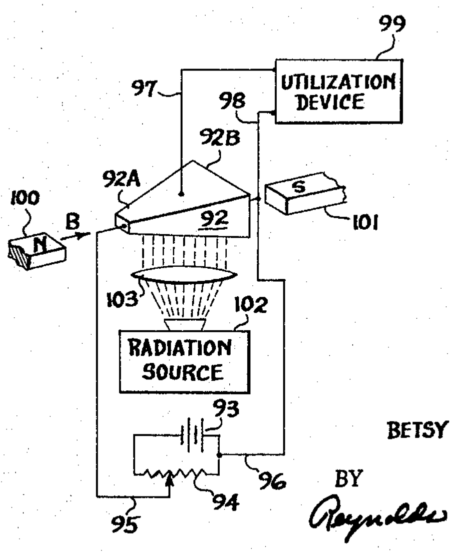
FIGURE 5 is a circuit diagram of another embodiment which includes a piece of semiconductor material having a gradation in cross sectional area.

In FIGURE 5 another embodiment of the present invention is illustrated wherein the piece of semiconductor material has a cross-sectional area which varies from one end to the other thereof and hence makes possible the establishment of a low density plasma within the material in the presence of a high electric field and a low magnetic field. Referring now to FIGURE 5 it will be seen that a piece of semiconductor material 92 is illustrated as being generally in the shape of a truncated cone with the cross-sectional area of one end 92A being substantially less than the cross-sectional area of the opposite end 92B. An electric field is established within the material 92 by means of a battery 93 having an impedance element shown as a resistor 94 connected across the terminals thereof and with a voltage tap 95 being selectively engaged with the impedance element 94 and connected to the end 92B while a lead 96 is connected to the positive terminal of the battery 93 and to the end 92A of the material 92. Thus an electric field having a selectable intensity is established within the material 92 by the battery 93. A pair of signal output terminals 97 and 98 are shown as being respectively connected to the material and to the lead 96 so that the signals generated within the device 92 can be provided to any suitable utilization device 99. A magnetic field is established within the material 92 which may be of variable intensity. However, for purpose of illustration, a permanent magnet including the pole pieces 100 and 101 is shown for purpose of illustration as providing the necessary relatively low intensity magnetic field which is substantially parallel to the direction of current flow which takes place within the material 92.

An electron-hole plasma is established within the material 92 and may be generated by various means. For purpose of illustration there is shown in FIGURE 5 a source of electromagnetic radiation 102 which is adapted to provide suitable radiation on the device 92 with a lens 103 being disposed between the source 102 and the piece of semiconductor material 92. In the embodiment of the invention illustrated in FIGURE 5 the semiconductor material 92 can be substantially homogeneous since the geometric configuration of the material will cause a plasma having a density gradient existing therein to be established within the material when at least one side of the piece of material is uniformly irradiated by the electromagnetic radiation provided by source 102 or when current carriers are injected therein by other suitable means, as for example by current carrying contacts.

The operation of the apparatus illustrated in FIGURE 5 is substantially the same as that associated with the various other embodiments illustrated in that a low density electron-hole plasma is established within the material 92 during the presence of a relatively intense electric field provided by the source 93 and in the presence of a parallel low intensity magnetic field. As a result of these conditions high frequency signals are generated and provided to the utilization device 99.

Various combinations of electric and magnetic field strengths are found to be suitable for use in the various embodiments of the present invention depending upon the specific type of material being used. Generally the electric field is in the order of several kilovolts per centimeter while the magnetic field is in the order of a few hundred gauss approximately parallel to the direction of current flow within the material. In the embodiment of the invention such as that illustrated in FIGURE 1 a rectangular parallelopiped of a crystal of semiconductor material has been found to be suitable. While not essential to the operation of the specific embodiments of the invention illustrated, it is found that cooling the semiconductor material increases the carrier mobility and therefore the frequency of the signals being generated is increased. A liquid nitrogen bath has been found to be adequate for such cooling.

In one specific device constructed in accordance with the teaching of the present invention the magnetic field strength was 400 gauss, the electric field strength was 38 kilovolts per centimeter, the resulting plasma density was $4\times10^{12}$ pairs per cubic centimeter, and the material was P-type germanium at room temperature. While the dimensions of the material can be varied, in this specific case a 0.4 x 0.4 x 10 mm. piece of material was used. The signals generated were in excess of $10^9$ c.p.s. Decreasing the temperature of the material, decreasing the intensity of the magnetic field, or increasing the strength of the electric field was found to increase the frequency of the signals being generated. It is found that irradiation of the semiconductor material by white light or the use of direct current injection contacts soldered to the material suffices to cause the generation of the desired electron-hole plasma within the material.

There has been disclosed an improved and much simplified high frequency signal generating apparatus which is capable of producing high frequency signals in the gigicycle range. External circuitry such as the usual inductor/capacitor type tank circuit is not required and hence the number of components is materially reduced. The density of the plasma established within the material is low and therefore excessive heating is avoided leading to the capability of continuous operation. While specific embodiments of the invention have been shown for purpose of illustration it is of course to be understood that those variations which become evident to a person skilled in the art as a result of the teachings set forth herein are intended to be incompassed within the following claims.

What is claimed is:

1. A signal generator comprising in combination: a block of semiconductor material having a gradation in a physical characteristic thereof; a signal output circuit coupled with said material; and means for establishing parallel electric and magnetic fields in said material and for injecting current carriers into said device to establish a low density plasma therewithin without the occurrence of impact ionization and with the plasma having a density gradient parallel to said fields; whereby high frequency signals are provided in said signal output circuit.

2. A signal generator in accordance with claim 1 wherein said material is a piece of semiconductor material having two sections and a gradation in the purity of said material exists between said sections, and wherein said last named means provides a reverse bias between said sections with said electric field being greater than one kilovolt per centimeter.

3. A signal generator in accordance with claim 1 and further including mechanical means for varying the point at which said signal output circuit is coupled with said material, whereby the frequency of the signals sensed in said output circuit may be varied.

4. A signal generator in accordance with claim 1 wherein said semiconductor material has at least one side thereof having a gradient in its surface finish.

5. A signal generator in accordance with claim 1 wherein said semiconductor material has a gradation in the cross sectional area thereof.

6. A signal generator in accordance with claim 1 wherein said semiconductor material is in the shape of a truncated cone.

7. A signal generator comprising in combination: current carrier injection means; means establishing parallel high intensity electric and low intensity magnetic fields; a piece of semiconductor material coupled with said injection means and disposed in said fields and having a gradation in a physical characteristic thereof parallel to said fields such that an electron-hole plasma having a density gradient is established within said material by said injection means in the presence of said fields; and a signal output circuit coupled with said material.

8. A signal generator in accordance with claim 7 wherein said material has impurity atoms disposed therein in a manner such that a gradient in the relative purity of said material exists in one direction therein.

9. A signal generator in accordance with claim 7 wherein at least one surface of said material has a gradient in surface condition in one direction thereof.

10. A signal generator in accordance with claim 7 wherein there is a gradient in the cross sectional area of said material between two portions thereof.

11. A signal generating circuit comprising in combination: a piece of semiconductor material having first and second sections and a gradation in relative purity between said sections; means coupled with said material operable to produce a high reverse electric bias between said sections and to produce a low density electron-hole plasma therein; magnetic field means establishing a magnetic field parallel to said electric field; a signal output circuit, and means selectively operable to vary the point of coupling of said output circuit with said material.

12. An oscillator comprising in combination: a piece of semiconductor material; means establishing an electric field within said material having an intensity greater than one kilovolt per centimeter; means establishing a magnetic field within said material parallel to said electric field; means for establishing a low density electron-hole plasma within said material; said material having a gradation in a physical characteristic thereof parallel to said fields whereby said low density plasma is established in the presence of said electric and magnetic fields by said last named means without the occurrence of impact ionization; and a signal output circuit directly connected to said piece of material.

13. A signal generator comprising in combination: a block of semiconductor material; a signal output circuit coupled with said material; electric and magnetic field means establishing parallel electric and magnetical fields in said material; and radiant energy means focusing radiant energy on said material in a radiant energy gradient pattern, whereby a low density plasma is established in said material and high frequency signals are provided in said signal output circuit.

References Cited by the Examiner

UNITED STATES PATENTS 3,011,133 11/1961 Koenig et al. -------- 331—107

OTHER REFERENCES

Larrabee et al.: Journal of Applied Physics, "The Oscillistor," 9/1960, pages 1519–1523.

NATHAN KAUFMAN, *Primary Examiner.*

J. KOMINSKI, *Assistant Examiner.*